United States Patent [19]
Allison

[11] 3,959,809
[45] May 25, 1976

[54] HIGH INVERSE GAIN TRANSISTOR
[75] Inventor: David F. Allison, Los Altos, Calif.
[73] Assignee: Signetics Corporation, Sunnyvale, Calif.
[22] Filed: May 10, 1974
[21] Appl. No.: 468,939

[52] U.S. Cl. ................................. 357/34; 357/20; 357/35
[51] Int. Cl.² ................. H01L 29/06; H01L 29/72
[58] Field of Search .................... 357/34, 20, 35

[56] References Cited
UNITED STATES PATENTS
3,657,612  4/1972  Wiedmann ........................... 357/34

Primary Examiner—Andrew J. James
Assistant Examiner—E. Wojciechowicz
Attorney, Agent, or Firm—Flehr, Hohbach, Test, Albritton & Herbert

[57] ABSTRACT

A high inverse gain semiconductor device including a one conductivity semiconductor substrate having a major surface and a buried region formed in said substrate of relatively high concentration one conductivity impurities extending to said major surface. A one conductivity semiconductor layer is formed on said major surface, said layer having a planar surface. An opposite conductivity base region is formed in said layer overlying said buried region and extends to said planar surface. The base region has an outwardly notched handle-shaped portion extending outward from said base region into said body and extending to said planar surface. A one conductivity additional region formed entirely within said opposite conductivity base region extends within said base region to form a relatively uniform base region exclusive of said handle-shaped portion having a relatively narrow base width between said additional region and said layer. The layer, base and additional region form a bilateral transistor capable of substantial forward gain when the additional region is utilized as an emitter and capable of relatively high inverse gain when said additional region is utilized as a collector.

3 Claims, 11 Drawing Figures

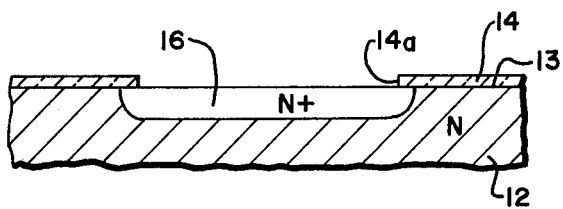
FIG.—1
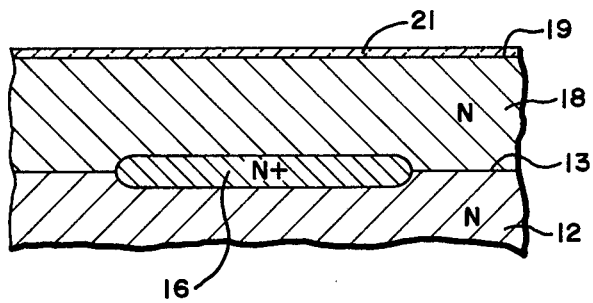
FIG.—2
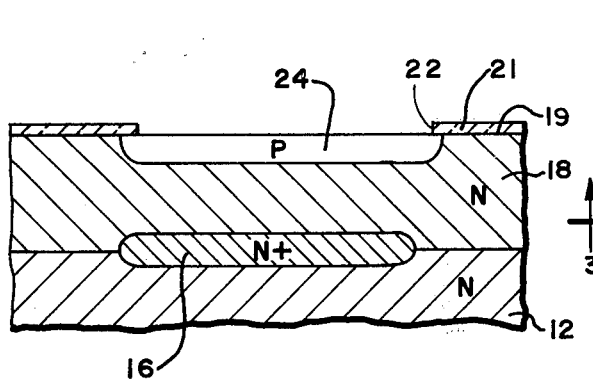
FIG.—3
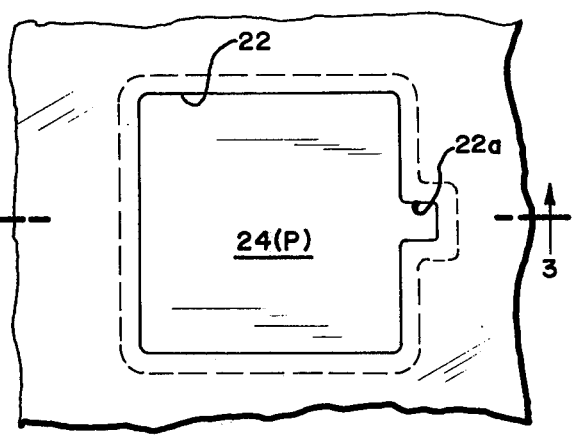
FIG.—4
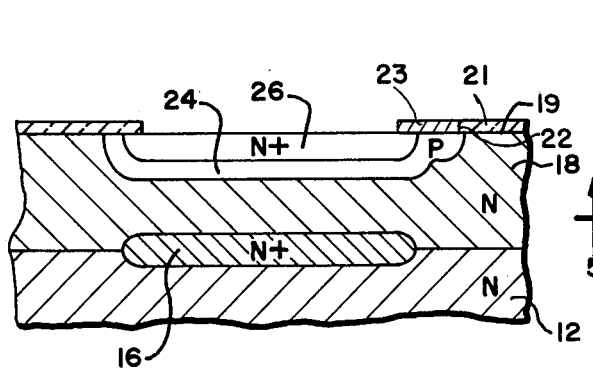
FIG.—5
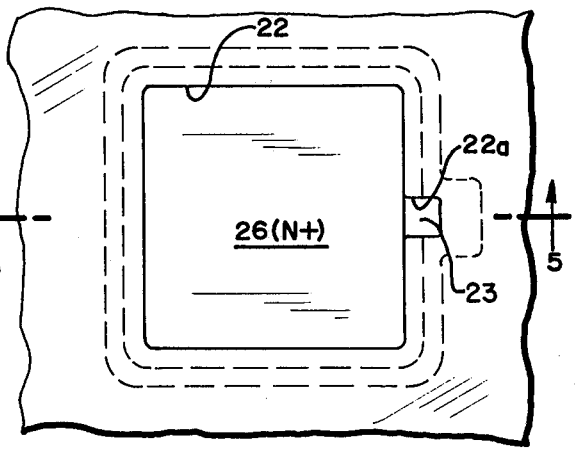
FIG.—6

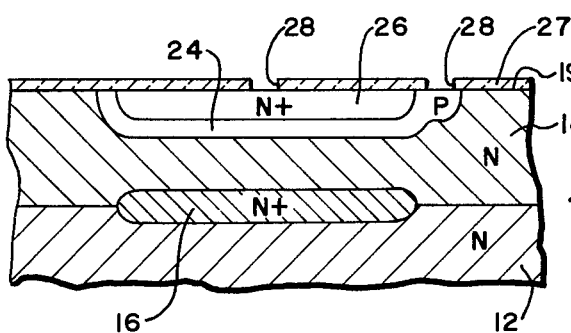
FIG.—7
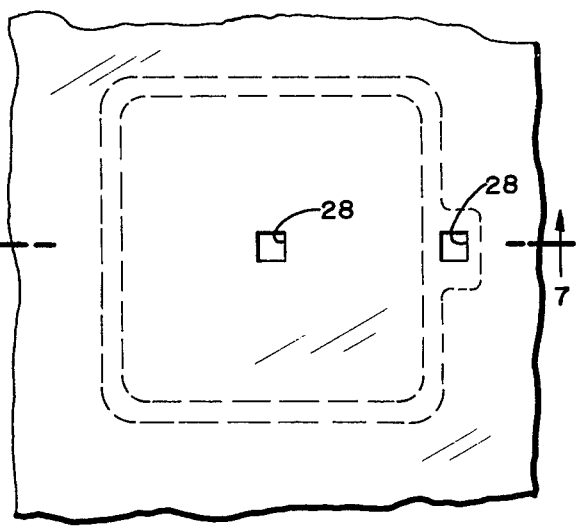
FIG.—8
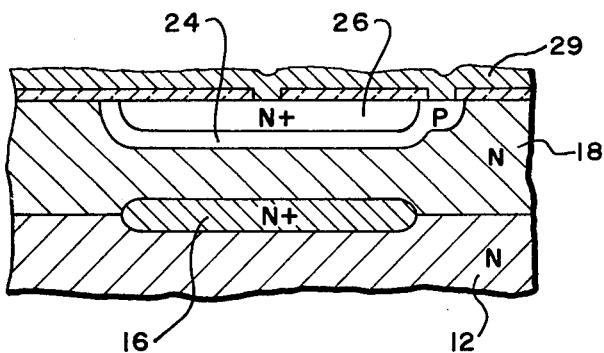
FIG.—9
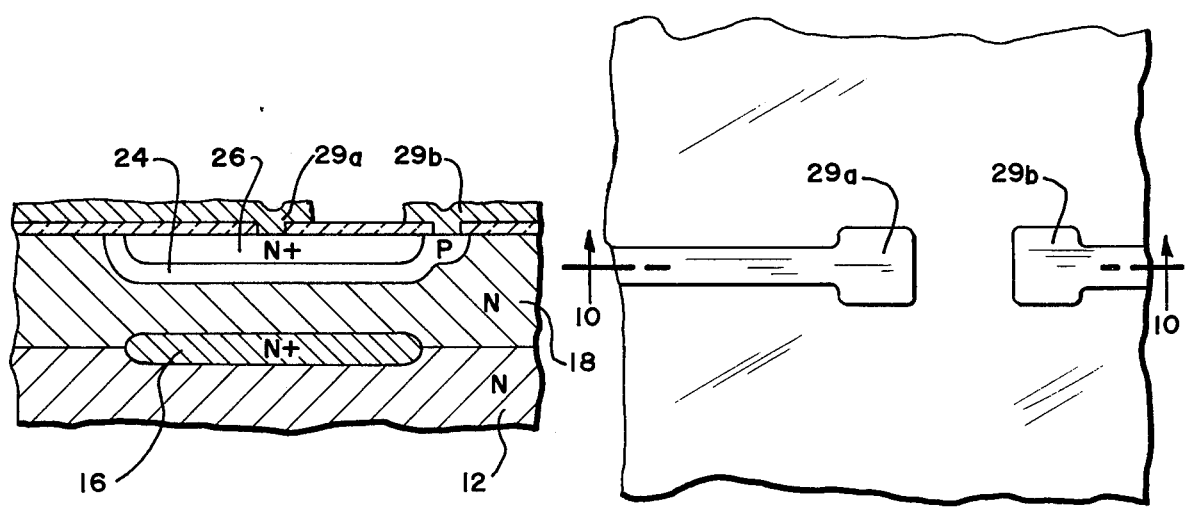
FIG.—10
FIG.—11

HIGH INVERSE GAIN TRANSISTOR

BACKGROUND OF THE INVENTION

This invention relates generally to a bipolar semiconductor device and a method for fabrication. More particularly, this invention relates to a bipolar semiconductor device suitable for bilateral operation as a transistor having substantial forward gain and relatively high inverse gain.

Although conventional bipolar transistors may exhibit some inverse current gain, that is, gain when the collector is used as an emitter and the emitter is, in turn, used as a collector, the gain is excessively low and generally unsatisfactory. In part, high inverse current gain is difficult to achieve in conventional structures because many electrons injected into the base region are never collected at the emitter because of the distance of some portions of the collector-base region from the N+ emitter, which in the inverse mode is used as a collector. Thus there is a need for a high inverse gain semiconductor device capable of high performance in many semiconductor applications.

OBJECTS AND SUMMARY OF THE INVENTION

Accordingly, it is the general object of the present invention to provide an improved performance high inverse gain semiconductor device and a method for fabrication.

It is a particular object of the present invention to provide a high inverse gain semiconductor device which may be utilized as a bilateral transistor capable of substantial forward gain when the conventional emitter region is utilized as an emitter and capable of relatively high inverse gain when the conventional emitter region is utilized as a collector.

The foregoing and other objects of the invention are achieved in a high inverse gain semiconductor device and method for fabrication, including a one conductivity semiconductor substrate having a major surface, and a buried region formed in said substrate of relatively high concentration one conductivity impurities extending to said major surface. A one conductivity semiconductor layer is formed on said major surface, said layer having a planar surface. An opposite conductivity base region is formed in said layer overlying said buried region and extending to said planar surface. The base region has an outwardly notched handle-shaped portion extending outward from said base region to said body and extending to said planar surface. A one conductivity additional region is formed entirely within said opposite conductivity base region extending within said base region to form a relatively uniform base region exclusive of said handle-shaped or key-shaped portion having a relatively narrow base width between said additional region and said layer. The layer, base and additional region form a bilateral transistor capable of substantial forward gain when the additional region is utilized as a emitter and capable of relatively high inverse gain when said additional region is utilized as a collector.

DESCRIPTION OF THE DRAWINGS

FIGS. 1–11 are respective cross-sectional and top plan views of a portion of a semiconductor body showing the processing steps in fabricating the high inverse gain semiconductor device in which FIG. 3 is a cross-sectional view taken along the line 3—3 of FIG. 4, and in which FIG. 5 is a cross-sectional view taken along the line 5—5 of FIG. 6 and where FIG. 7 is a cross-sectional view taken along the line 7—7 of FIG. 8 and where FIG. 10 is a cross-sectional view taken along the line 10—10 of FIG. 11.

DESCRIPTION OF THE PREFERRED EMBODIMENTS

The sequential processing steps for fabrication of the high inverse gain semiconductor device are shown in the accompanying FIGS. Starting with a one conductivity semiconductor substrate 12 having a major surface 13, a first masking layer 14 is formed thereon having an aperture 14a formed in said layer which exposes a portion of surface 13 as shown in FIG. 1. A buried region 16 of relatively high concentration one conductivity impurities is formed in said substrate 12 by diffusing the impurities through the aperture 14a of the mask 14 and extends to surface. Next mask 14 is removed, and a one conductivity semiconductor layer 18 is formed such as by conventional epitaxial deposition on surface 13. The layer 18 has a planar surface 19. A masking layer 21, such as of silicon dioxide is next formed on planar surface 19 as shown in FIG. 2.

Next an aperture 22 is opened in layer 21 and generally overlies region 16. The aperture 22 has an outwardly extending notched portion 22a as shown in FIGS. 3 and 4. Next an opposite conductivity type region 24 is formed by diffusion of opposite conductivity impurities into the layer 18 by using the masking layer 21 having the aperture 22 therein as a mask. The region 24 extends to the surface 19.

The outwardly extending notched portion 22a of the layer 21 is masked over or covered, by using a photoresist to form an additional mask 23 as shown in FIG. 6. An additional one conductivity type region 26 is then formed by diffusion in region 24 by using the masks 21 and 23. The region 26 extends to the surface 19.

Masks 22 and 23 are then removed and a new insulating layer 27 is formed on surface 19. Apertures 28 are formed in the layer 12 and are positioned so that they expose a portion of additional region 26 and a portion of the outwardly notched handle-shaped region 24 as shown in FIGS. 7 and 8.

A conductive metal layer 29 is formed on the surface of layer 27 and in the apertures 28 to contact the regions 24 and 26 as shown in FIG. 9. Next layer 29 may be patterned to provide portions 29a connected to said additional region 26 and 29b connected to said base region 24, FIGS. 10 and 11.

Thus it is apparent that a high inverse gain semiconductor device has been provided having a substantially uniform base width. More particularly, it is apparent that the high inverse gain semiconductor device may be utilized as a bilateral transistor capable of substantial forward gain when the conventional emitter region herein described as an additional regions is utilized as an emitter and further capable of relatively high inverse gain when said emitter region herein described as an additional region, is utilized as a collector.

I claim:

1. In a high inverse gain semiconductor device, a one conductivity type semiconductor substrate having a major surface, a buried region formed in said substrate of relatively high concentration of one conductivity type impurities extending to said major surface, a one conductivity type semiconductor layer formed on said major surface, said layer having a planar surface, an opposite conductivity base region formed in said layer overlying said buried region and extending to said planar surface and being defined by a first PN junction, a one conductivity additional region formed entirely within said opposite conductivity base region and being defined by a second PN junction and extending to said surface to form a base region of a relatively uniform narrow width extending to said planar surface with the areas of the first and second PN junctions overlying said buried regions being substantially of the same size said base region having a portion thereof of greater width of said planar surface to form a contact region for said base region, a insulating layer formed on said planar surface, lead means carried by said insulating layer and extending through said insulating layer and making contact to said contact regions of said base region and said additional region, said layer, base and additional region forming a bilateral transistor capable of substantial forward gain using said additional region as an emitter and said layer as a collector and capable of relatively high inverse gain using said additional region as a collector and said layer as an emitter.

2. A semiconductor device as in claim 1 wherein said one conductivity is N type and said opposite conductivity is P type material.

3. A semiconductor device as in claim 1 wherein said one conductivity is P type and said opposite conductivity is N type material.

* * * * *